United States Patent

Kobayashi et al.

Patent Number: 5,801,833
Date of Patent: Sep. 1, 1998

[54] METHOD OF PRODUCING MASTER AND WORKING PATTERN PLATES FOR ETCHING AND PHOTOLITHOGRAPHIC APPARATUS THEREFOR

[75] Inventors: Kei Kobayashi; Yoji Shiraishi, both of Tokyo, Japan

[73] Assignee: Dai Nippon Printing Co., Ltd., Tokyo, Japan

[21] Appl. No.: 580,637

[22] Filed: Dec. 29, 1995

Related U.S. Application Data

[62] Division of Ser. No. 67,340, May 25, 1993, Pat. No. 5,500,326, which is a continuation of Ser. No. 666,351, Mar. 8, 1991, abandoned.

[51] Int. Cl.$^6$ ............................................. G01B 9/02
[52] U.S. Cl. ............................ 356/358; 356/401; 356/363
[58] Field of Search ................................. 356/345, 358, 356/363, 401

[56] References Cited

U.S. PATENT DOCUMENTS

| | | | |
|---|---|---|---|
| 3,744,904 | 7/1973 | Loprest et al. | |
| 3,823,016 | 7/1974 | Di Fazio et al. | |
| 4,043,815 | 8/1977 | Klymus. | |
| 4,215,938 | 8/1980 | Ferrand et al. | 356/356 |
| 4,327,172 | 4/1982 | Martin et al. | |
| 5,151,749 | 9/1992 | Tanimoto et al. | 356/358 |

FOREIGN PATENT DOCUMENTS

| | | | |
|---|---|---|---|
| 62-206555 | 9/1987 | Japan | 430/300 |
| 259755 | 2/1990 | Japan | 430/300 |
| 2150838 | 6/1990 | Japan | 430/300 |

*Primary Examiner*—Frank G. Font
*Assistant Examiner*—Robert Kim
*Attorney, Agent, or Firm*—Dellett and Walters

[57] ABSTRACT

In a method of producing master and working pattern plates for etching to form a shadow mask, various etching patterns are needed, for example, a pattern of predetermined holes for passing electron beams, a pattern of register marks necessary for accurate alignment of a pair of obverse and reverse working pattern plates, and a frame pattern for cutting off a portion which is to be a shadow mask from a metal plate by etching process. These individual pattern data required for etching are first prepared and then subjected to logical operation to prepare data representative of a synthetic pattern which is to be finally drawn on a photosensitive plate. Then, all the necessary patterns, including the frame pattern, register mark pattern, hole pattern, etc., are formed by continuous and collective exposure process by use of the synthetic pattern data, thereby eliminating the need for the step of aligning the individual patterns by a manual operation, which has heretofore been essential for multiple exposure, and thus solving not only the conventional problems in terms of both quality and process but also the problem attributable to the positioning accuracy of a photolithographic apparatus in which control is effected by a laser interferometric measuring device in an environment other than a vacuum.

2 Claims, 16 Drawing Sheets

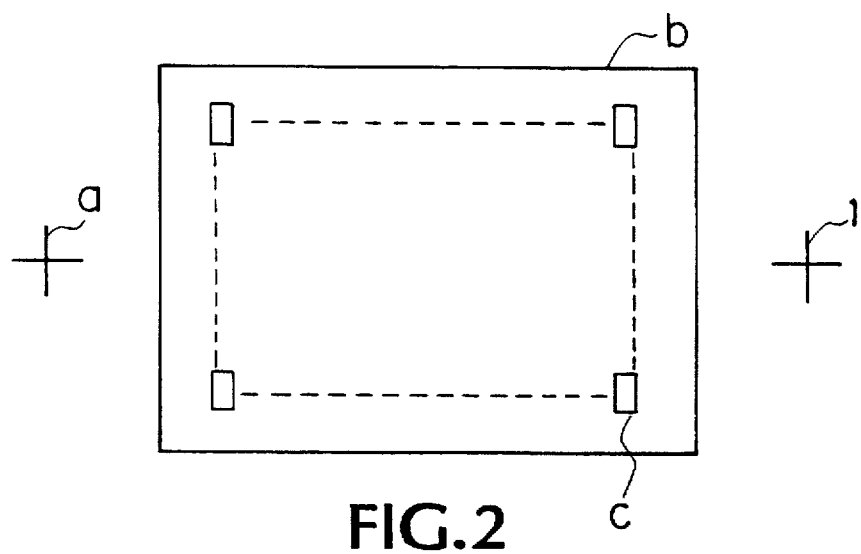
FIG.2
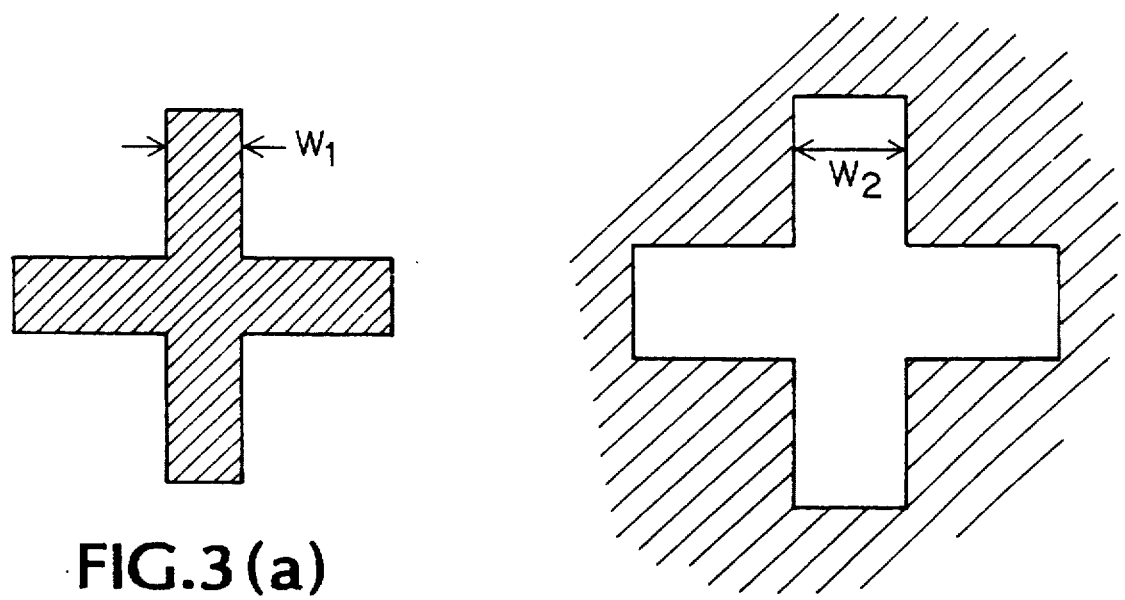
FIG.3(a)
FIG.3(b)

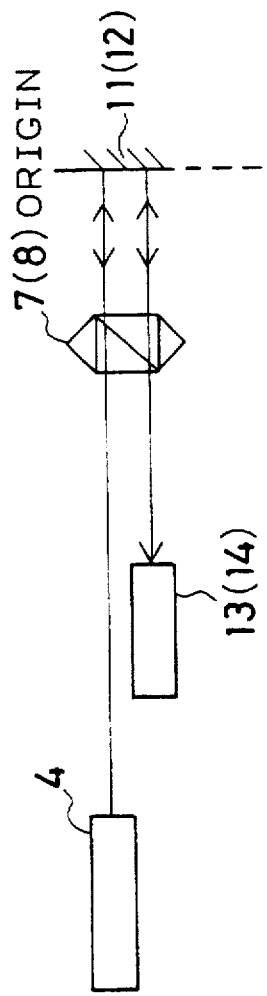
FIG.11 (a) ORIGIN SETTING
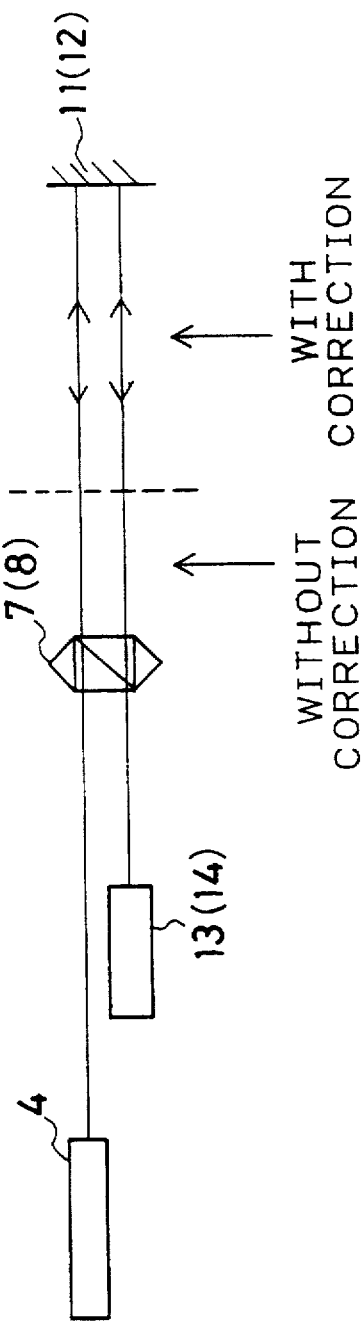
FIG.11 (b) AFTER MOVEMENT

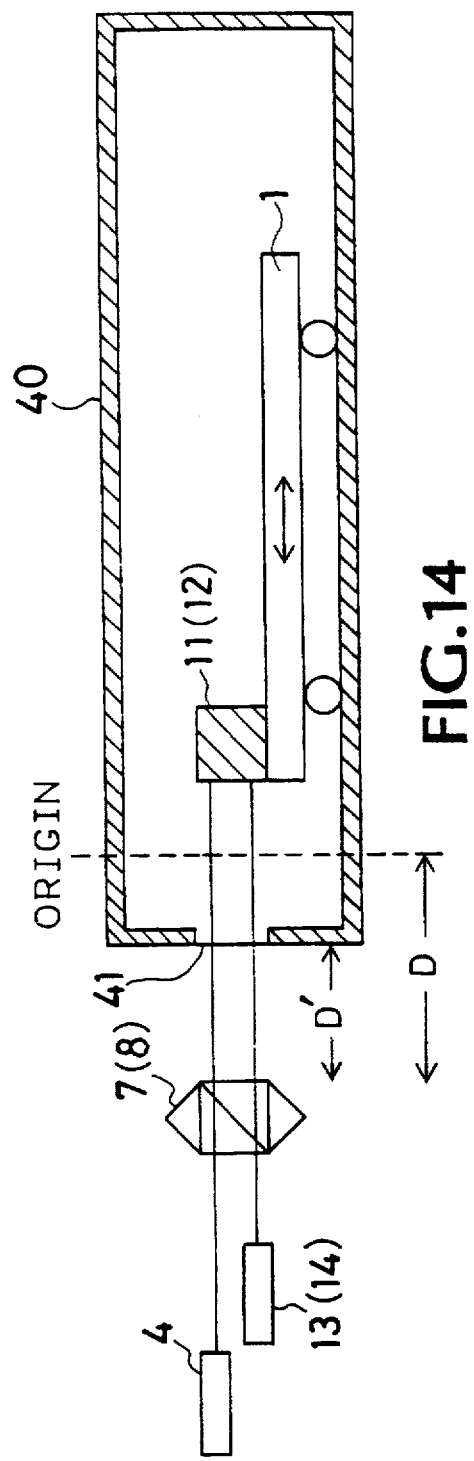

METHOD OF PRODUCING MASTER AND WORKING PATTERN PLATES FOR ETCHING AND PHOTOLITHOGRAPHIC APPARATUS THEREFOR

This is a divisional of application Ser. No. 08/067,340 filed on May 25, 1993, now U.S. Pat. No. 5,500,326, which is a continuation of application Ser. No. 07/666,351, filed Mar. 8, 1991, now abandoned.

BACKGROUND OF THE INVENTION

The present invention relates to a method of producing pattern plates for etching. More particularly, the present invention relates to a method of producing a pair of obverse and reverse working pattern plates for use in the manufacture of etched products such as shadow masks for color picture tubes, lead frames for semiconductor devices, etc., and a pair of obverse and reverse master pattern plates used to produce such working pattern plates. The present invention further relates to a photolithographic apparatus which may be employed to carry out the above-described pattern plate producing method.

Etched products such as shadow masks are generally produced by exposing a metal plate having a resist coated over the obverse and reverse sides thereof through a pair of obverse and reverse working pattern plates for etching each formed with a predetermined etching pattern, the working pattern plates being in close contact with the two sides of the metal plate, and developing the resist to form resist patterns on the obverse and reverse sides of the metal plate, and then etching the two sides of the plate formed with the respective resist patterns.

Working pattern plates which are used in the actual etching process are produced by use of original pattern plates, which are known as master pattern plates. More specifically, a pair of obverse and reverse master pattern plates are first produced, and then working pattern plates are produced by use of the respective master pattern plates. For experimental etching or small-scale production, a photosensitive glass plate having the required pattern formed thereon by a photolithographic machine may be used directly as a working pattern plate. In the case of mass production, for example, it is common practice to produce working pattern plates by use of master pattern plates and use the working pattern plates in etching process carried out along a production line.

In general, of the two working pattern plates, one which has a hole pattern with a larger diameter is called "obverse working pattern plate", and the other "reverse working pattern plate".

In the production of a pair of obverse and reverse pattern plates, it has been conventional practice to divide all the patterns required for etching into a plurality of discrete patterns, i.e., a pattern of marks used in the alignment of a pair of obverse and reverse pattern plates (these alignment marks will hereinafter be referred to as "register marks"), a frame pattern, a pattern of holes, etc., and to form these patterns on a single photosensitive plate in the form of a synthetic pattern by partial exposure or multiple exposure, as disclosed, for example, in Japanese Patent Post-Examination Publication Nos. 63-19860 and 63-19861 (1988).

However, the above-described conventional method requires a great deal of time and labor to carry out the operation since it is necessary to effect multiple exposure with a plurality of discrete pattern plates being successively brought into contact with a single photosensitive plate.

Because in the etching process along a production line a pair of obverse and reverse working pattern plates are brought into close contact with both sides of a steel plate which are coated with a resist, the two working pattern plates are formed with register mark patterns to align the positions of the obverse and reverse etching patterns relative to each other. Hitherto, since the obverse and reverse master pattern plates are formed by multiple exposure, when each master pattern plate is formed, the relative position of the patterns to be formed into a synthetic pattern may change due to a manual operation, which gives rise to a problem in terms of quality, that is, nonuniformity in the quality of the products.

In addition, no matter which of various known photolithographic apparatuses is used to write etching patterns, the resulting patterns involve various distortions, more or less, i.e., a distortion in orthogonality, that is, an error in which an angle which should be a right angle is deviated therefrom, or a distortion in length, that is, an error in which a length becomes longer or shorter than the designed one. Thus, any etching pattern that is written on an original pattern plate has some distortions; under certain circumstances, distortions may be present everywhere on a single original plate. The tendency of distortions is the same for all patterns that are written by the same photolithographic apparatus under the same conditions. Accordingly, if the same photolithographic apparatus is used to produce a pair of obverse and reverse original pattern plates and etching is effected by use of working pattern plates that are produced on the basis of these original plates, distortions that are produced by this photolithographic apparatus will double.

SUMMARY OF THE INVENTION

It is an object of the present invention to provide a method of producing master and working pattern plates for etching in which all the patterns required for etching are synthesized together in the form of data to form synthetic pattern data and a photosensitive plate is subjected to continuous and collective exposure by use of the synthetic pattern data, thereby solving the problems of the prior art, that is, an undesired change in the relative position of individual patterns and the nonuniformity of quality due to the conventional manual operation, and also simplifying the operation process.

It is another object of the present invention to provide a photolithographic apparatus which may be effectively used to carry out the above-described method of producing master and working pattern plates for etching.

In the present invention, pattern data which are needed to produce a shadow mask, for example, by etching, i.e., data about a pattern of register marks, a pattern of predetermined holes and a frame pattern, are prepared, and these individual pattern data are subjected to logical operation to prepare synthetic pattern data, and then continuous and collective exposure is effected with a photolithographic apparatus by use of the synthetic pattern data to produce a master pattern plate, thereby solving the problems such as an undesired change in the relative position of individual patterns, i.e., the frame pattern, register mark pattern, hole pattern, etc., and the nonuniformity of quality due to the conventional manual operation, and also simplifying the process of producing a shadow mask or other etched product.

More specifically, various etching patterns are needed to produce a shadow mask, i.e., a pattern of predetermined holes for passing electron beams, a pattern of register marks for accurate alignment of a pair of obverse and reverse working pattern plates, and a frame pattern for cutting off a portion which is to be a shadow mask from a metal plate by etching process. In the present invention, data representative of these individual patterns required for etching are first prepared and then subjected to logical operation to prepare data representative of a synthetic pattern which is to be finally drawn on a photosensitive plate, such as that shown in FIG. 2. Then, all the necessary patterns, including the frame pattern, register mark pattern, hole pattern, etc., are formed by continuous and collective exposure process by use of the synthetic pattern data, thereby eliminating the need for the step of aligning the individual patterns by a manual operation, which has heretofore been essential for multiple exposure, and thus solving the conventional problems in terms of both quality and process. It should be noted that, in FIG. 2, a, b and c denote a register mark pattern, a frame pattern and a hole pattern, respectively.

To cope with distortions that are generated due to the mechanical accuracy of the photolithographic apparatus employed, one of the pair of obverse and reverse patterns, e.g., the obverse pattern, is subjected to reversal development in a desired step, thereby obtaining a desired black-and-white, i.e., positive-negative, condition for the obverse and reverse patterns and setting the direction of each pattern in a proper condition to enable distortions of the obverse and reverse patterns due to the photolithographic apparatus to cancel each other.

Thus, according to the production method of the present invention, all the etching patterns needed to produce a shadow mask or other etched product are synthesized together in the form of data and continuous and collective exposure is effected by use of the synthetic pattern data to produce a pattern plate. There is therefore no need for the conventional multiple exposure process. Thus, it is possible to eliminate the need for the time and labor which would otherwise be required for the multiple exposure process and to solve the problems accompanying the multiple exposure process.

As a photolithographic apparatus which may be used to carry out the above-described method of producing master and working pattern plates for etching, the present invention provides a photolithographic apparatus of the type having a device that controls the movement of a moving mirror of a Michelson interferometer from its origin by counting the number of interference fringes, or Doppler shift frequency, from the interferometer with a counter, thereby controlling the relative position of an exposure head and a photosensitive plate, the apparatus comprising a position controller that sets the origin of the moving mirror at a distance from a beam splitter of the Michelson interferometer, moves the moving mirror to the origin to reset the count of the counter to zero and then feedback-controls the position of the moving mirror on the basis of the difference between a value obtained by multiplying the count of the counter by the wavelength in the air at the present time and a target position of the moving mirror, the position controller having a memory means for storing the wavelength in the air at the time when the moving mirror is moved to the origin and the counter is reset to zero, and the position controller being arranged such that a value obtained by dividing the distance between the beam splitter and the origin by the wavelength stored in the memory means is added to the count of the counter; the resulting sum is multiplied by the wavelength in the air at the present time; the distance between the beam splitter and the origin is subtracted from the resulting product; and the position of the moving mirror is feedback-controlled on the basis of the difference between the result of the subtraction and a target position of the moving mirror.

With the above-described photolithographic apparatus, even if the wavelength changes due to a change in the pressure, temperature or humidity of the air in the dead path between the beam splitter and the origin, the position error due to the wavelength change is corrected, so that, even if there is a change in the atmospheric pressure, temperature or humidity of the environment of the photolithographic apparatus, no irregularities will occur on the resulting master pattern plate. In addition, since all the necessary patterns are formed by collective exposure process by use of the synthetic pattern data, the accuracy of the relative position of the individual patterns becomes extremely high.

The photolithographic apparatus used to carry out the above-described production method may comprise a position controller that sets the origin of the moving mirror at a distance from a beam splitter of the Michelson interferometer, moves the moving mirror to the origin to reset the count of the counter to zero and then feedback-controls the position of the moving mirror on the basis of the difference between the count of the counter and a value obtained by dividing a target position of the moving mirror by the wavelength in the air at the present time, the position controller having a memory means for storing the wavelength in the air at the time when the moving mirror is moved to the origin and the counter is reset to zero, and the position controller being arranged such that the distance between the beam splitter and the origin is added to a target position of the moving mirror; the resulting sum is divided by the wavelength in the air at the present time; and the position of the moving mirror is feedback-controlled on the basis of the difference between the resulting quotient and a value that is obtained by adding to the count of the counter a value obtained by dividing the distance between the beam splitter and the origin by the wavelength stored in the memory means.

Still other objects and advantages of the invention will in part be obvious and will in part be apparent from the specification.

The invention accordingly comprises the features of construction, combinations of elements, and arrangement of parts which will be exemplified in the construction hereinafter set forth, and the scope of the invention will be indicated in the claims.

BRIEF DESCRIPTION OF THE DRAWINGS

FIG. 2 is a view employed to explain synthetic pattern data;

FIGS. 3(a) and 3(b) illustrate the difference in size between register mark patterns drawn on a pair of obverse and reverse patterns;

FIGS. 11(a) and 11(b) are views employed to explain a dead path;

FIG. 14 is a schematic view of an arrangement in which a part of the photolithographic apparatus is placed in a vacuum.

DESCRIPTION OF THE PREFERRED EMBODIMENTS

Embodiments of the method of producing master and working pattern plates for etching according to the present invention will first be described below with reference to the accompanying drawings.

Prior to the description of the embodiments, definitions of terms used in this application will be given below. As a photosensitive material that is coated on a glass plate, a silver halide emulsion is used. The term "positive pattern" is herein employed to mean a pattern plate which is formed in such a manner that hole and frame patterns are digitized to prepare pattern writing data; the patterns are drawn on a photosensitive plate by exposure on the basis of the pattern writing data; and the patterned portions are blackened directly or by contact exposure to form a synthetic pattern. In contrast, when the patterned portions are whitened directly or by contact exposure, the resulting pattern plate is referred to as a negative pattern. In other words, a pattern in which the portions digitized and exposed by a photolithographic apparatus are blackened is referred to as a positive pattern, whereas, a pattern in which the patterned portions are whitened is referred to as a negative pattern. On the other hand, as for register marks, a pattern which is drawn by digitizing the inside of it, as shown in FIG. 3(a), is referred to as a positive pattern, whereas, a pattern which is drawn by digitizing the area surrounding a register mark, as shown in FIG. 3(b), is referred to as a negative pattern.

In this application, the term "developing process" means ordinary development that is applied to a silver halide emulsion. Accordingly, in the developing process the exposed portions are blackened. In contrast, the term "reversal development" means a developing process in which the black-and-white relationship in a pattern is maintained as it is. In other words, reversal development blackens the unexposed portions. It should be noted that the reversal development by the printing process explained hereinafter is described, for example, in Japanese Patent Laid-Open (KOKAI) No. 55-164829 (1980), or Photographic Society of Japan, "Elements of Photographic Engineering—Silver Halide Photography," Corona-sha, Jan. 30, 1979, pp. 341-342.

A first embodiment will be explained below with reference to FIGS. 1(a) and 1(b).

Figure 1A:
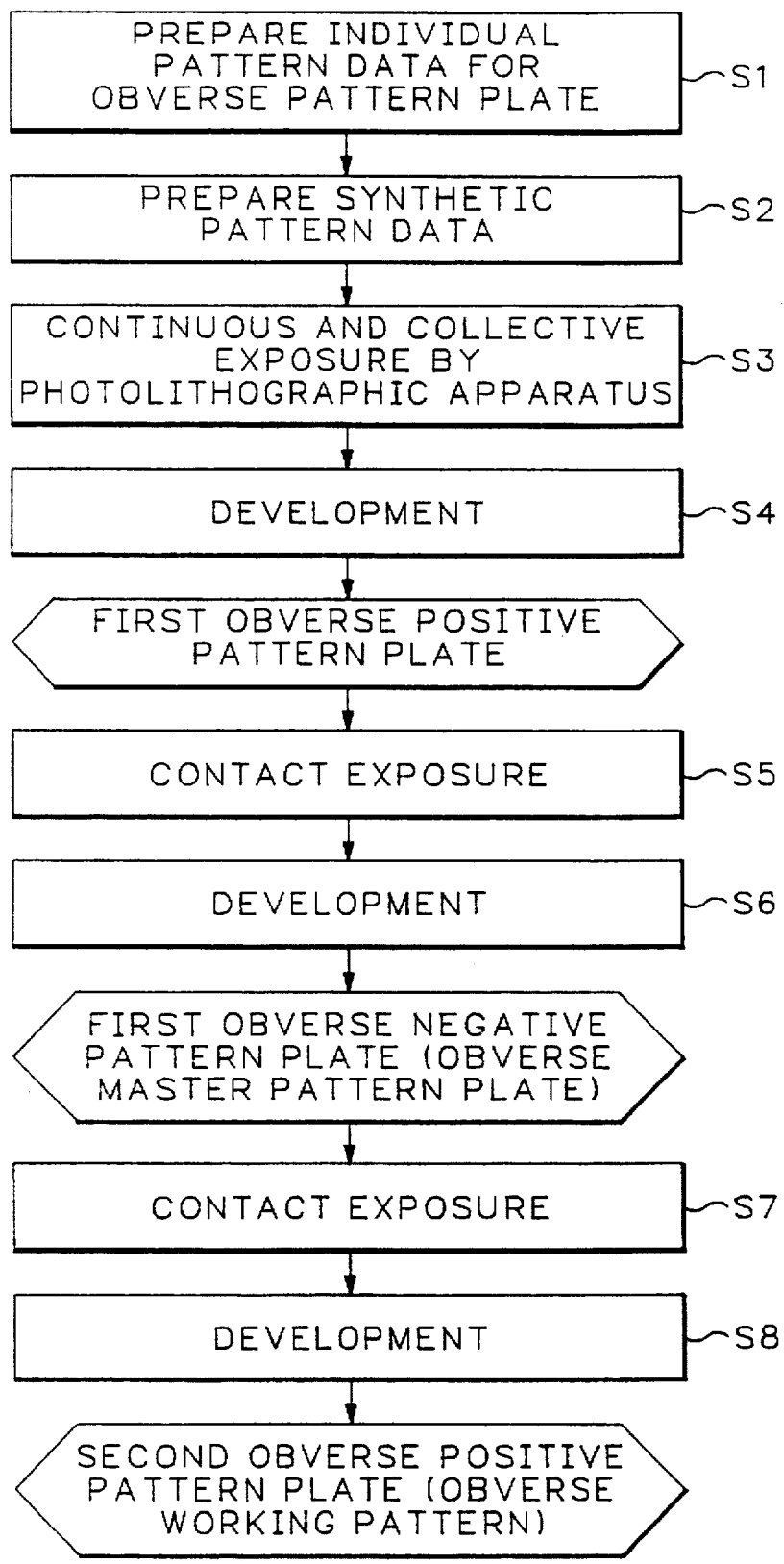
FIGS. 1(a) and 1(b) are flowcharts showing a first embodiment of the production method according to the present invention.
Figure 1B:
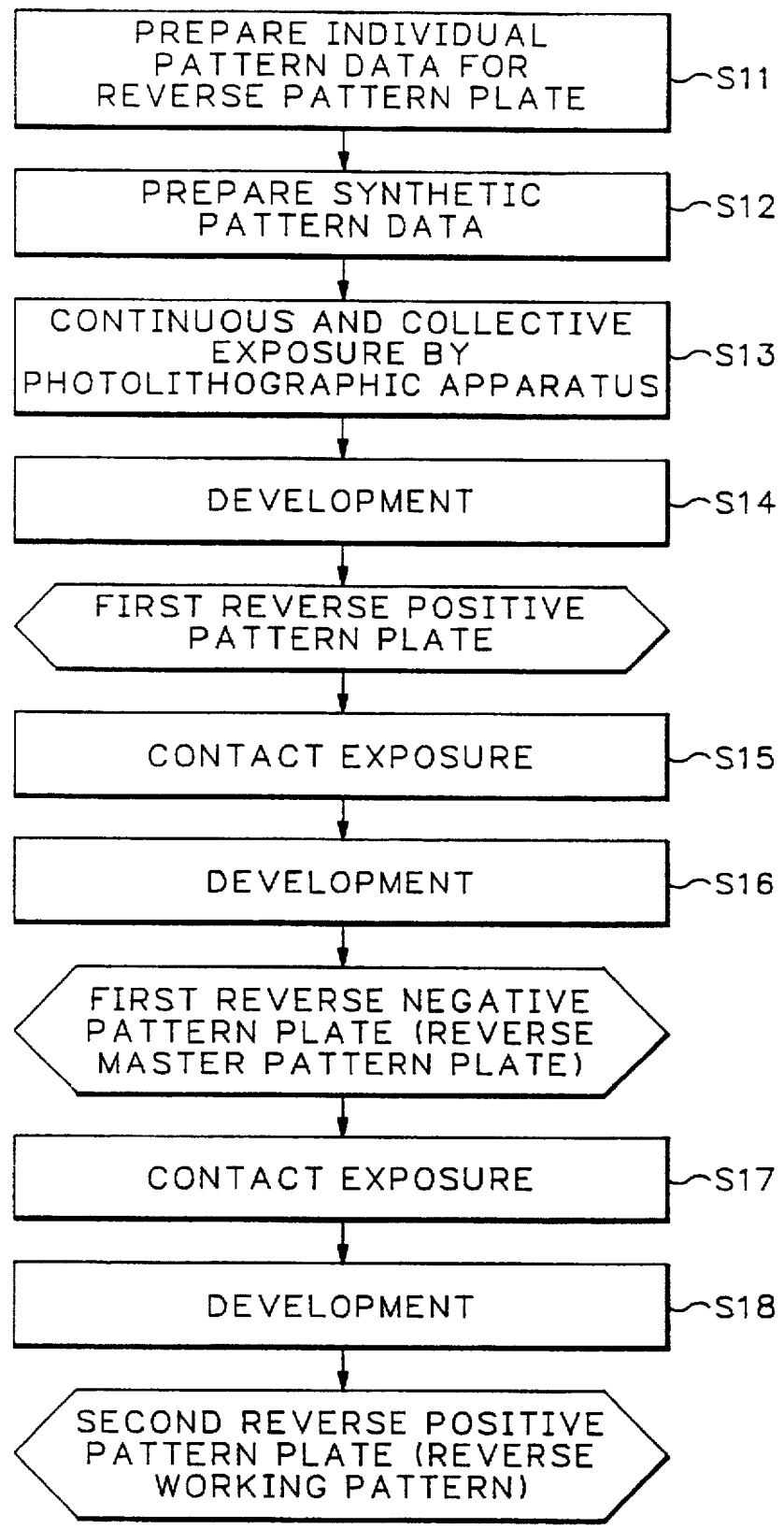

FIGS. 1(a) and 1(b) are flowcharts respectively showing processes of producing an obverse working pattern plate and a reverse working pattern plate, which are used in a pair.

In Step S1, frame pattern data, hole pattern data, register pattern data and so forth for an obverse working pattern plate are prepared separately. In this example, as for register marks, negative data is prepared, whereas, as for the other patterns, positive data is prepared. Then, as for each data, positive data is the data which is prepared by digitizing the pattern area. Especially, as for register marks, positive data is prepared by digitizing the oblique line portions shown in FIG. 3(a), and negative data is prepared by digitizing the oblique line portions shown in FIG. 3(b). Similarly, as for frame pattern, data for positive data is prepared by digitizing the frame pattern area, and as for hole pattern, data for positive data is prepared by digitizing the hole pattern area.

In Step S2, the individual pattern data prepared in Step S1 are subjected to logical operation to prepare synthetic pattern data from these pattern data. At this time, the positional relationship between the patterns must be established as designed, as a matter of course.

In Step S3, patterns are drawn continuously and collectively on a photosensitive glass plate, for example, by a photolithographic apparatus (described later) according to the present invention and by use of the synthetic pattern data obtained in Step S2, thereby forming a latent image corresponding to the synthetic pattern data. Thereafter, developing process is carried out in Step S4. Thus, a first obverse positive pattern plate is obtained.

In Step S5, contact exposure is effected by use of the first obverse positive pattern plate obtained in Step 4, and developing process is carried out in Step S6, thus obtaining a first obverse negative pattern plate, which is defined as an obverse master pattern plate.

Next, contact exposure is effected in Step S7 by use of the obverse master pattern plate obtained in Step S6, and developing process is carried out in Step S8, thus obtaining a second obverse positive pattern plate, which is defined as an obverse working pattern plate.

As for the reverse pattern, frame pattern data, hole pattern data, register pattern data and so forth for reverse pattern plates are first prepared separately in Step S11. Here, as for the patterns other than the register marks, data for positive patterns is prepared in the same way as in the case of the obverse pattern plates, whereas, as for the register marks, data for positive patterns is prepared. The reason for this is to facilitate the alignment of a pair of obverse and reverse working pattern plates in etching process carried out along a production line by forming a negative register pattern on one of the two working pattern plates and a positive register pattern on the other.

Steps S12 to S18 subsequent to the above are the same as Steps S2 to S8 in the process of producing the obverse working pattern plate: That is, by the developing process in Step S16, a reverse master pattern plate is obtained; and by the developing process in Step S18, a reverse working pattern plate is obtained.

It will be apparent that the patterns of the register marks on the obverse and reverse pattern plates are not necessarily limited to cross-shaped patterns such as those shown in FIGS. 3(a) and 3(b) and that any desired patterns, for example, circular patterns or a combination of circular and cross-shaped patterns, may be employed as long as the employed patterns facilitate the alignment of the obverse and reverse pattern plates. Negative-positive relation of the register marks on the obverse and reverse patterns is determined so that the black-and-white conditions of the obverse and reverse working pattern plates are reverse to each other.

However, the register patterns on the obverse and reverse pattern plates need to be different in size from each other. For example, assuming that the register patterns on the two pattern plates are such as those shown in FIGS. 3(a) and 3(b), respectively, the line width $W_2$ of the negative pattern shown in FIG. 3(b) is made larger than the line width $W_1$ of the positive pattern shown in FIG. 3(a). Thus, the operator can recognize clearly the relative position of the obverse and reverse patterns and hence conduct the alignment even more accurately. To provide a difference in the register pattern size between the obverse and reverse patterns, the line widths of the positive and negative patterns may be made different from each other in the stage of the individual patterns. However, it is possible to attain the purpose even more readily by setting the exposure light energy for the register pattern on either one of the obverse and reverse patterns to be larger or smaller than that for the register pattern on the other. Since the method of controlling the size of the register patterns during the exposure process is a known matter, detailed description thereof is omitted. It should be noted that the difference between $W_1$ and $W_2$ may be on the order of from several μm to several tens of μm. The control of the size of the register patterns may be carried out in any exposure step, but it is preferably conducted in the step of producing a master pattern plate in Step S5 or S15.

In the case of small-scale production, a single working pattern plate will suffice for each of the obverse and reverse patterns; therefore, positive pattern plates that are obtained in Steps S4 and S14 may be used as working pattern plates directly, as a matter of course.

Although in the above-described embodiment patterns that are necessary for a pair of obverse and reverse pattern plates are only hole, frame and register patterns for simplification of the explanation, it is a matter of course that any other necessary patterns can be synthesized in the stage of individual pattern data to produce obverse and reverse master and working pattern plates in the same way as the above.

Next, a second embodiment will be explained with reference to FIGS. 4(a) and 4(b).

Although obverse and reverse master and working pattern plates can be produced by the method described above, distortions are produced during the exposure process by the photolithographic apparatus, as stated above, and it is therefore necessary to compensate for these distortions. In the present invention, the compensation for the distortions is made by applying reversal development to either the obverse or reverse pattern.

Figure 4A:
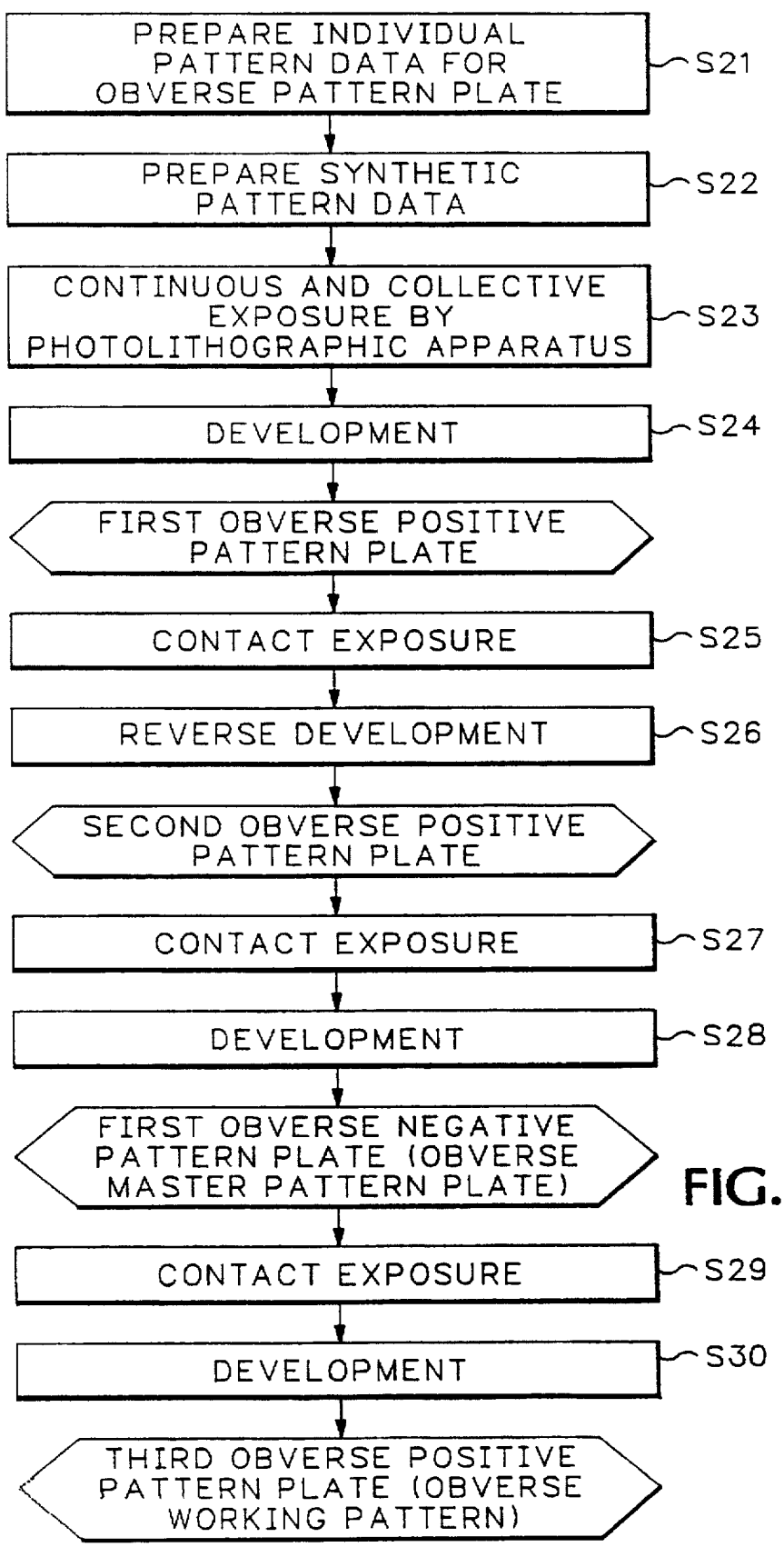
FIGS. 4(a) and 4(b) are flowcharts showing a second embodiment of the production method according to the present invention.

FIG. 4(a) is a flowchart showing a production process that is carried out when an obverse pattern is subjected to reversal development.

First, in Step S21, individual pattern data for an obverse pattern plate are prepared separately. In this example, as for register marks, data for positive patterns is prepared, and as for the other patterns, data for positive patterns is also prepared.

Thereafter, synthetic pattern data is prepared in Step S22, and continuous and collective exposure is effected with the photolithographic apparatus by use of the synthetic pattern data to form a latent image corresponding to the synthetic pattern data (Step S23), and then developing process is carried out (Step S24), thus obtaining a first obverse positive pattern plate.

Next, contact exposure is effected with the first obverse positive pattern plate (Step S25), and in Step S26, ordinary developing process is carried out for the register pattern portions, whereas, reversal developing process is conducted for the pattern portions other than the register pattern portions, thus obtaining a second obverse positive pattern plate.

Next, contact exposure is effected with the second obverse positive pattern plate (Step S27), and developing process is carried out (Step S28), thus obtaining a first obverse negative pattern plate, which is defined as an obverse master pattern plate. Next, with the obverse master pattern plate, contact exposure is effected (Step S29), and developing process is carried out (Step S30), thus obtaining a third obverse positive pattern plate, which is defined as an obverse working pattern plate.

Figure 4B:
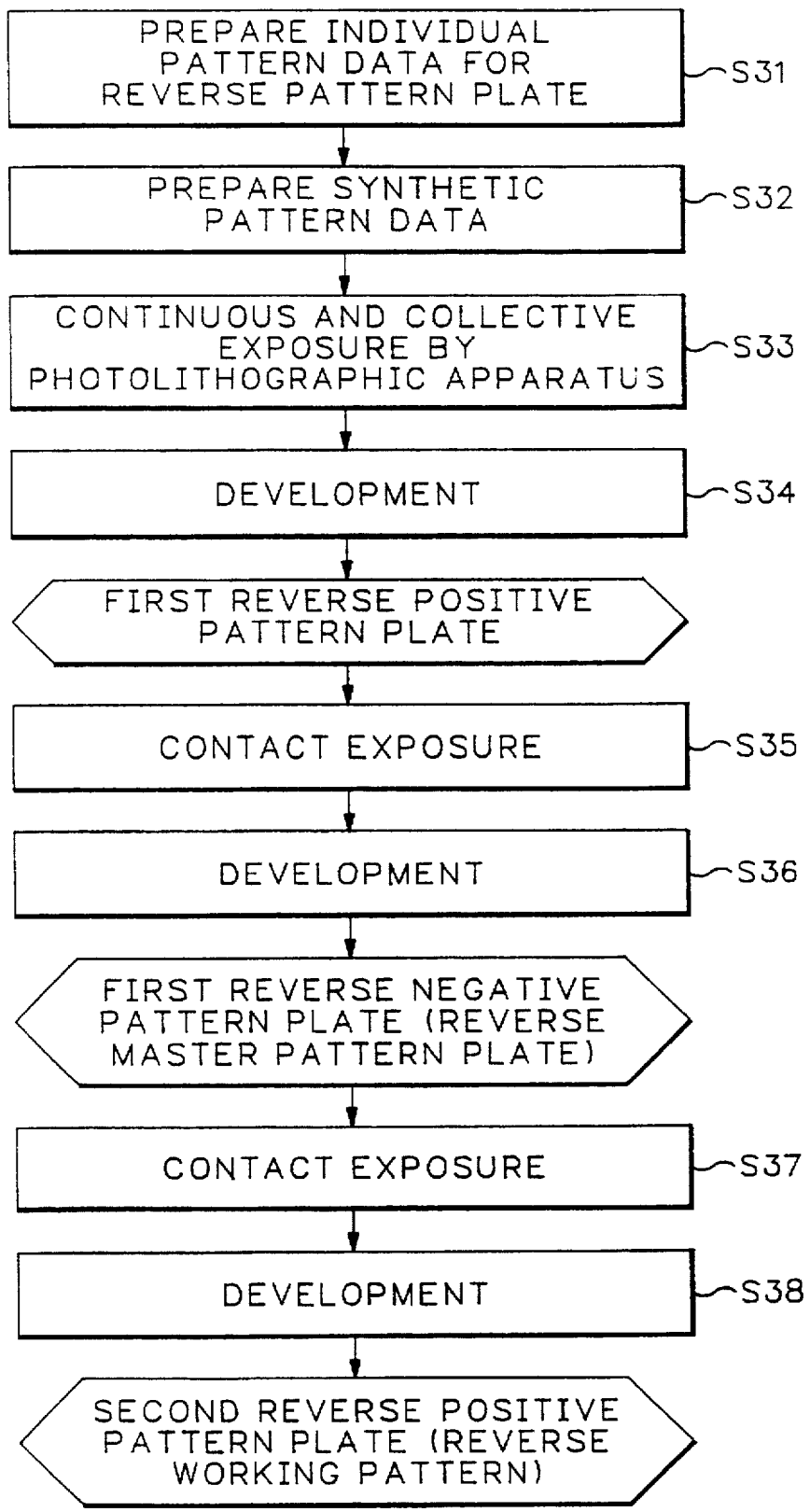

FIG. 4(b) shows a method of producing a reverse working pattern plate, in which Steps S31 to S38 are the same as the corresponding steps shown in FIG. 1(b). However, individual pattern data which are prepared in Step S31 are such that, as for register marks, data for positive patterns is prepared, and as for the other patterns, data for positive patterns is also prepared, in the same way as in the case of data for obverse pattern plates prepared in Step S21.

The obverse and reverse working pattern plates obtained by the above-described process are opposite to each other in the black-and-white relationship in the register patterns. For the other patterns, the distortions produced by the photolithographic apparatus appear in the opposite directions to each other on the two working pattern plates. Accordingly, the distortions can be canceled by employing the pair of obverse and reverse working plate patterns.

A third embodiment will next be explained. In the second embodiment, a second obverse positive pattern is obtained by reversal development carried out after a first obverse positive pattern plate has been obtained. This method is advantageous for the management of plates, but it has the disadvantage of necessitating a relatively large number of steps. In this embodiment, therefore, a description will be given about a method by which the number of steps is reduced.

Figure 5A:
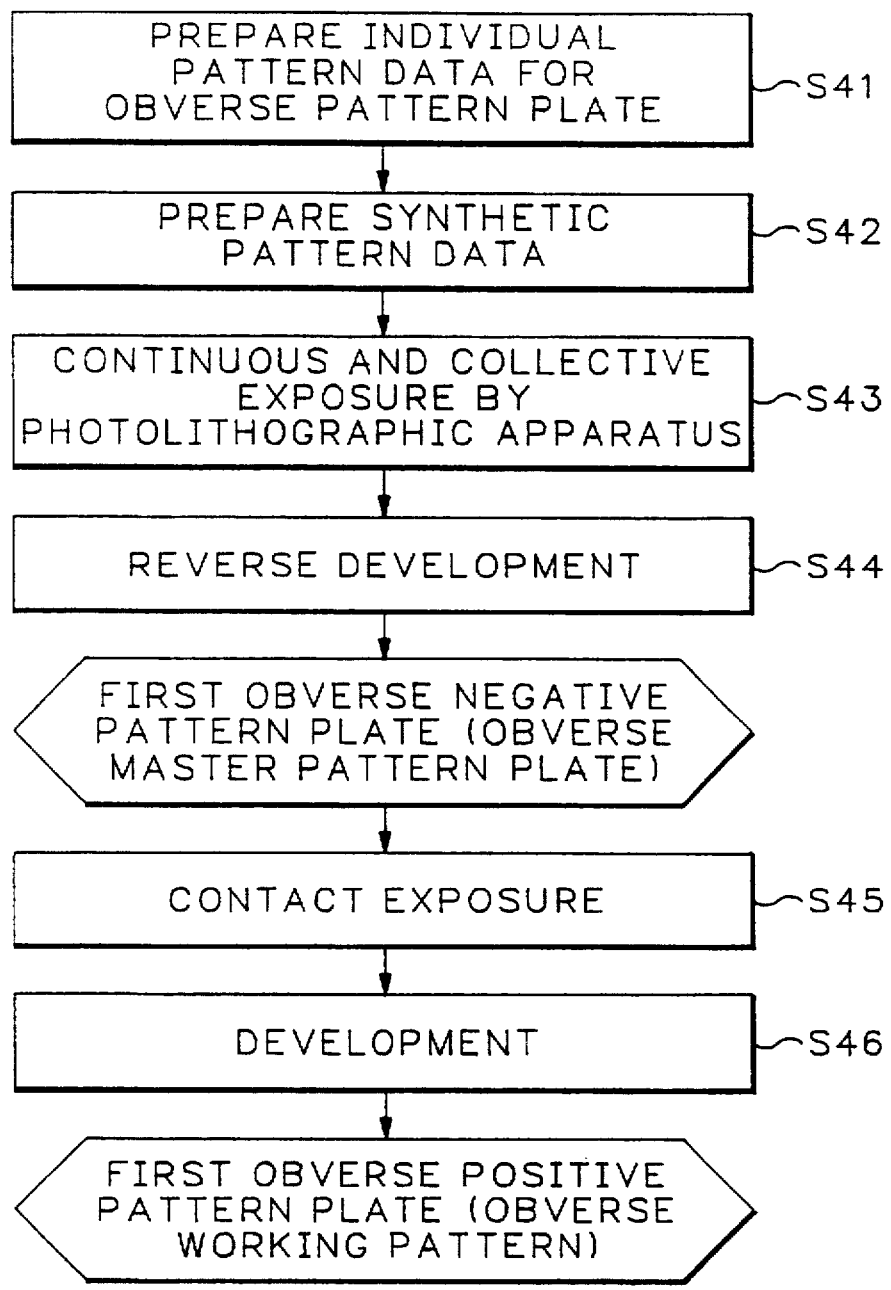
FIGS. 5(a) and 5(b) are flowcharts showing a third embodiment of the production method according to the present invention.
Figure 5B:
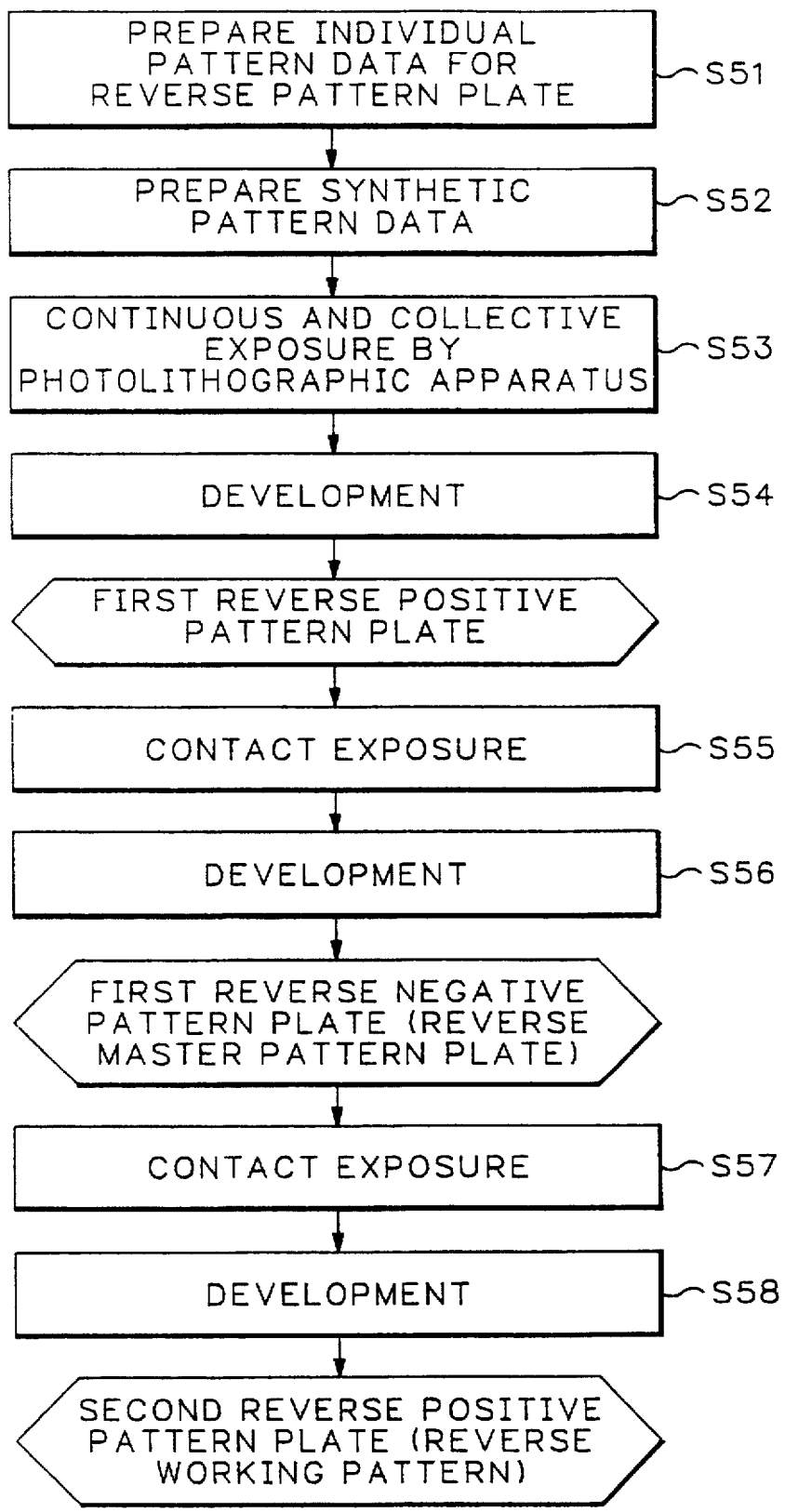

FIGS. 5(a) and 5(b) are flowcharts respectively showing processes of producing an obverse working pattern plate and a reverse working pattern plate, which are used in a pair. The process of producing a reverse working pattern plate is the same as that shown in FIG. 4(b). As for the obverse pattern, Steps S41 to S43 are the same as Steps S21 to S23 in FIG. 4(a). In this embodiment, however, after the continuous and collective exposure, the register pattern portion is subjected to ordinary developing process, whereas the other pattern portions are subjected to reversal development (Step S44). Thus, a negative pattern plate is obtained, which is defined as an obverse master pattern plate.

Thereafter, contact exposure is effected (Step S45), and developing process is carried out (Step S46), thus obtaining a first obverse positive pattern plate, which is defined as an obverse working pattern plate.

As will be readily understood by a comparison between FIGS. 4(a) and 5(a), it is apparent that this embodiment enables a reduction in the number of steps.

Although in the above-described embodiments reversal development is carried out for the obverse pattern, it will be apparent that reversal development may be carried out for the reverse pattern.

In addition, this embodiment is the same as the first embodiment in that a difference is made in the register pattern size between the obverse and reverse patterns.

Although some embodiments of the method of producing master and working pattern plates for etching have been described above, it should be noted that the present invention is not necessarily limited to the described embodiments and that various modifications may be imparted thereto. For example, although in the foregoing embodiments a silver halide emulsion is used as a photosensitive material, a negative photoresist comprising a polymeric material may be employed instead. It is also possible to employ a positive photoresist comprising a polymeric material; in such a case, the black-and-white relationship in each pattern data should be reversed.

As will be clear from the foregoing description, according to the method of producing master and working pattern plates for etching of the present invention, all patterns required for etching are synthesized together in the form of data, and a photosensitive plate is subjected to continuous and collective exposure by use of the synthetic pattern data. It is therefore possible to solve the problems in terms of quality of the prior art, i.e., an undesired change in the relative position of individual patterns and nonuniformity in quality of the products, and also possible to simplify the operation process.

In addition, distortions that are produced by the photolithographic apparatus can be compensated for by incorporating a reversal development process into an appropriate step before the step of producing a working pattern plate.

The following is a description of the photolithographic apparatus that is employed in the exposure process explained in connection with FIGS. 1(a), 1(b), 2, 3(a), 3(b), 4(a), 4(b), 5(a) and 5(b).

Prior to the description of the photolithographic apparatus according to the present invention, a conventional photolithographic apparatus will be explained.

With the recent development of extended definition TV and display devices for computer graphics, shadow masks for use in these devices have been demanded to have higher quality. The quality of shadow masks greatly depends on the quality of master pattern plates that are employed in the manufacture thereof. Accordingly, the degree of accuracy of a pair of obverse and reverse master pattern plates decides the quality of the resulting shadow masks. In the method of producing master and working pattern plates for etching, irregularities which are brought about by the photolithographic apparatus constitute an obstacle to production of highly accurate master pattern plates. The irregularities occur due to a lowering in the positional accuracy of small hole patterns which should be arranged regularly. It is essential to check the lowering in the positional accuracy in order to produce shadow masks with fewer irregularities.

Figure 6:
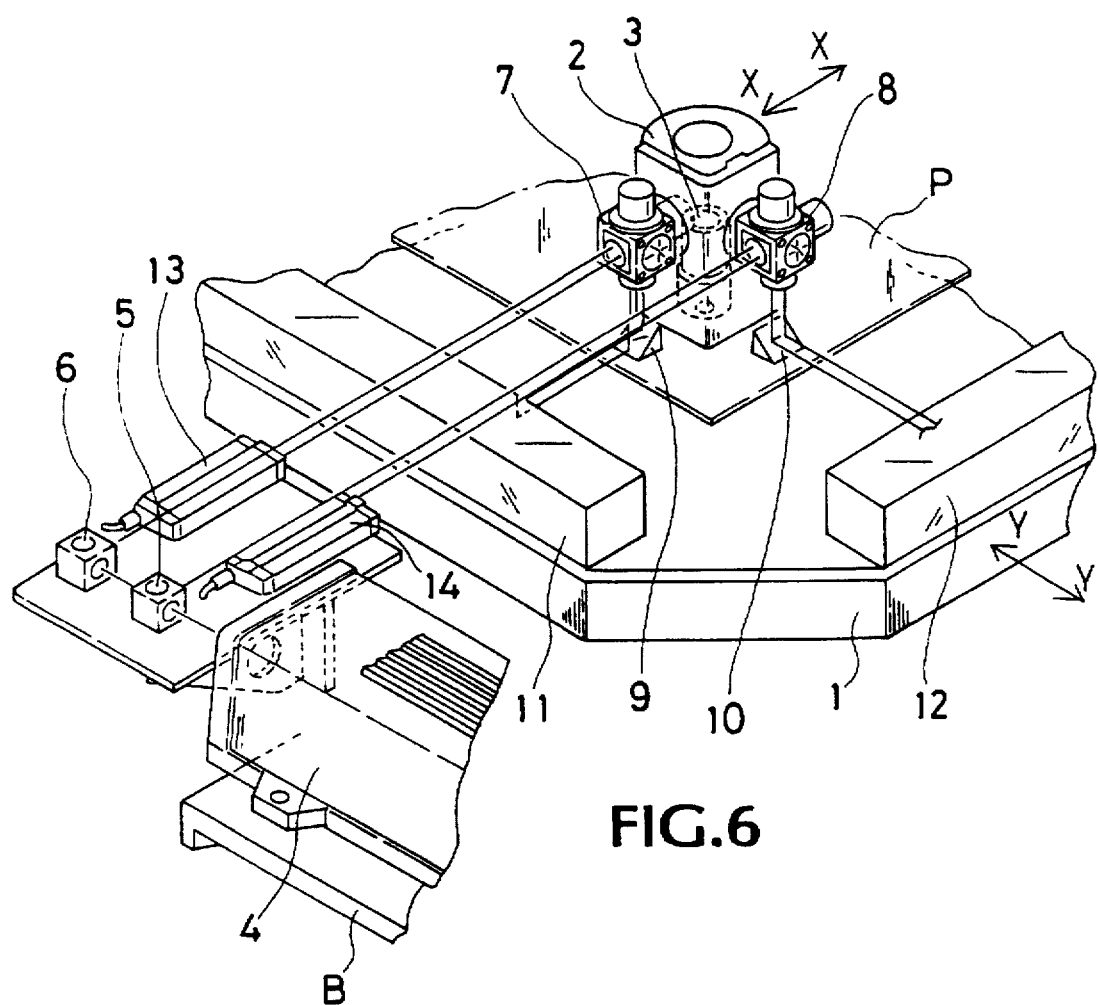
FIG. 6 is a fragmentary perspective view of a photolithographic apparatus for forming shadow mask patterns.
Figure 7:
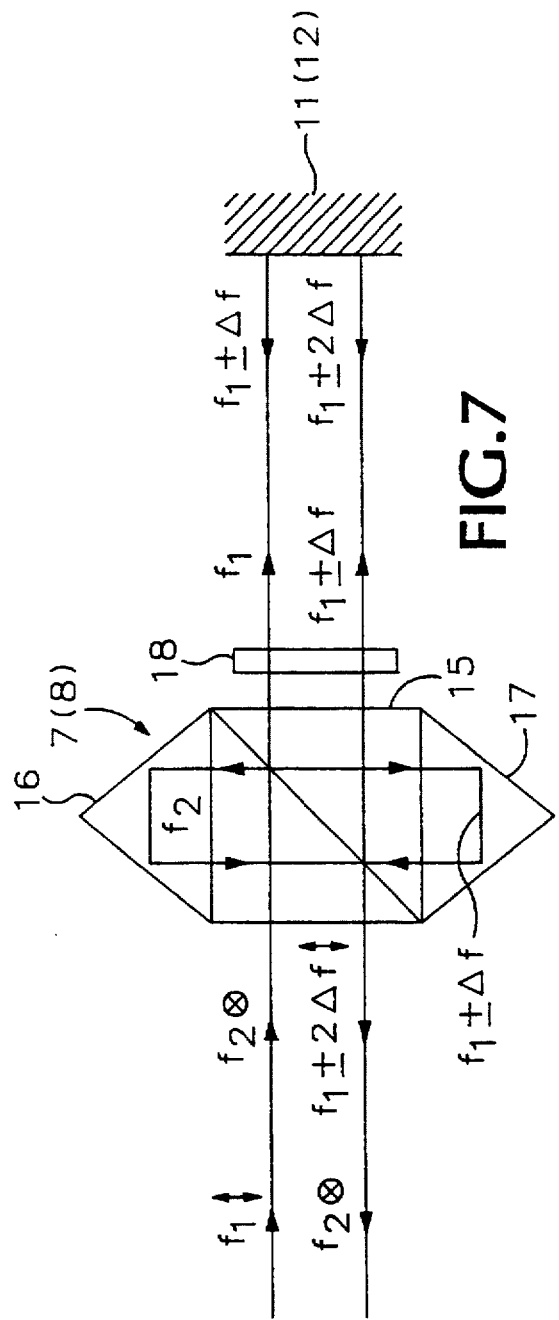
FIG. 7 shows an optical arrangement of one example of a Michelson interferometer.

Incidentally, a typical conventional photolithographic apparatus effects overall patterning by repeating exposure while stepwisely moving a photosensitive plate to be a mask pattern original plate and an exposure head relative to each other in directions X and Y. FIG. 6 is a fragmentary perspective view of one example of the conventional photolithographic apparatus. A photosensitive plate P is set on a stage 1 that is moved in a direction Y under control. An exposure head 2 that projects a hole pattern of a mask onto the photosensitive plate P through a reduction lens 3 is attached to a plate (not shown) that is moved in a direction X under control. Accordingly, it is possible to effect patterning of a mask pattern original plate by repeating exposure while stepwisely moving the stage 1 and the exposure head 2 in the respective directions Y and X accurately with a predetermined pitch. To effect accurate control of the stepwise movement, an X-direction interferometer 7 and a Y-direction interferometer 8 are attached to the exposure head 2, and moving mirrors 11 and 12, each constituting a part of the associated interferometer, are attached to the stage 1 in opposing relation to the associated interferometers 7 and 8. The exposure head 2 is further equipped with mirrors 9 and 10 for directing light rays which enter and emerge from the associated interferometers 7 and 8 toward the respective moving mirrors 11 and 12. The apparatus body B, on which the above-described elements are mounted, is provided with a laser light source 4 that oscillates simultaneously light rays of two near-by frequencies $f_1$ and $f_2$ which are in common to the two interferometers 7 and 8, a beam splitter 5 that splits the light in order to direct part of the light toward the Y-direction interferometer 8, a mirror 6 that directs the remaining light toward the X-direction interferometer 7, and X- and Y-direction detectors 13 and 14 that receive beam light from the associated interferometers 7 and 8 to detect a movement in each direction. FIG. 7 shows the optical arrangement of each interferometer. More specifically, the interferometer 7 (8) comprises a polarization beam splitter 15 and a pair of corner cube mirrors 16 and 17 which are cemented to the upper and lower surfaces, respectively, of the polarization beam splitter 15. A quarter-wave plate 18 is disposed in front of the reverse surface of the interferometer 7 (8) with respect to the surface at the incidence side. The light of frequency $f_1$ from the laser light source 4 is polarized in parallel to the plane of FIG. 7, while the light of frequency $f_2$ is polarized in a direction normal to the plane of the figure. These two light rays enter the polarization beam splitter 15, and the light of frequency $f_1$, which is polarized in parallel to the plane of the figure, passes through the split plane and enters the quarter-wave plate 18 where the polarization is converted into circular polarization. The circularly polarized light strikes on the moving mirror 11 (12) to receive Doppler shift $\Delta f$ and then enters the quarter-wave plate 18 again, where the circular polarization is converted into polarization in a direction normal to the plane of the figure. The polarized light is reflected by the split plane to enter the lower corner cube mirror 17 and then returns along an optical path which is a little offset from the optical path of the incident light. The light is then reflected by the split plane to enter the quarter-wave plate 18 along a light path which is offset from the previous optical path, where the polarization is converted into circular polarization. The circularly polarized light strikes on the moving mirror 11 (12) again to receive Doppler shift $\Delta f$, and with Doppler shift of $2\Delta f$ in total, the light enters the quarter-wave plate 18, where it is converted into light polarized in parallel to the plane of the figure. The light passes through the split plane and emerges from the polarization beam splitter 15. Meantime, the light of frequency $f_2$, which is polarized in a direction normal to the plane of the figure, is reflected by the split plane to enter the upper corner cube mirror 16 and returns along an optical path which is a little offset from the optical path of the incident light. The light is reflected by the split plane again to be output in superposition on the signal of frequency $f_1$ that has received Doppler shift of $2\Delta f$. Accordingly, the amount of movement of the photosensitive plate P relative to the exposure head 2 can be obtained by taking out Doppler shift $2\Delta f$ of the light returning from the moving mirror 11 (12) for each direction (Doppler shift may be taken out, for example, by subtracting the beam signal frequency of $f_1$ and $f_2$ from the beam signal frequency of $f_1 \pm 2\Delta f$ and $f_2$), and totaling the number of pulses, which are output, for example, one pulse per period of Doppler frequency $2\Delta f$. In this way, the movement d is obtained as being $d = N \times \lambda/4$ from the relation of $\Delta f = 2vnf/c = 2vn/\lambda_0 = 2v/\lambda$, wherein: v is the speed of the moving mirror 11 (12); n, the refractive index of the air; f, the frequency of laser light; c, the light velocity in a vacuum; $\lambda_0$, the wavelength in a vacuum; and $\lambda$, the wavelength in the air. Accordingly, by counting the number of such pulses, exposure can be repeated with the stage 1 and the exposure head 2 being stepwisely moved accurately with a predetermined pitch in the respective directions X and Y, so that accurate patterning of a mask pattern original plate can be effected. The same is the case with other examples of the photolithographic apparatus in which the exposure head moves in the X-Y directions or the stage having a photosensitive plate mounted thereon moves in the X-Y directions.

Figure 8:
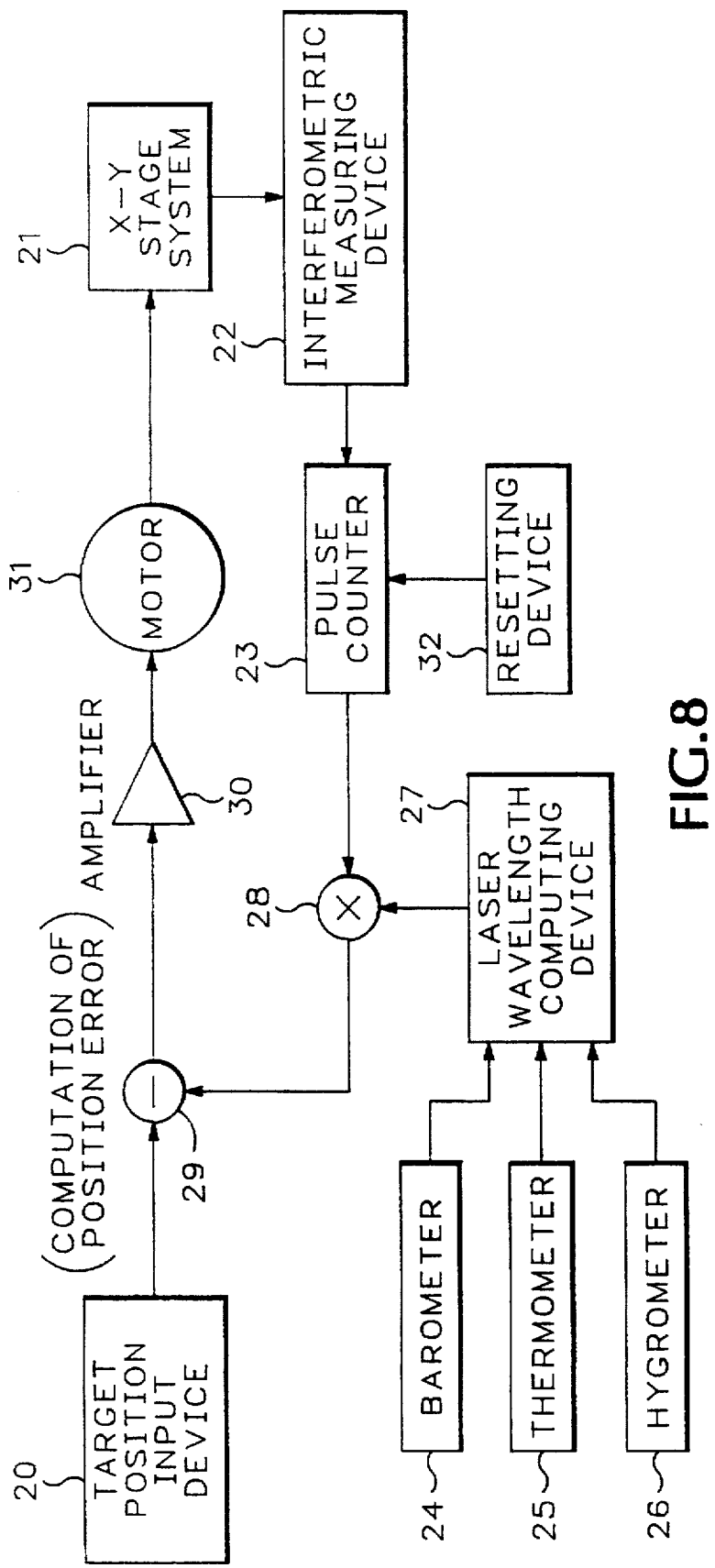
FIG. 8 is a block diagram of one example of the exposure head position control system in the conventional photolithographic apparatus for forming shadow mask patterns.
Figure 9:
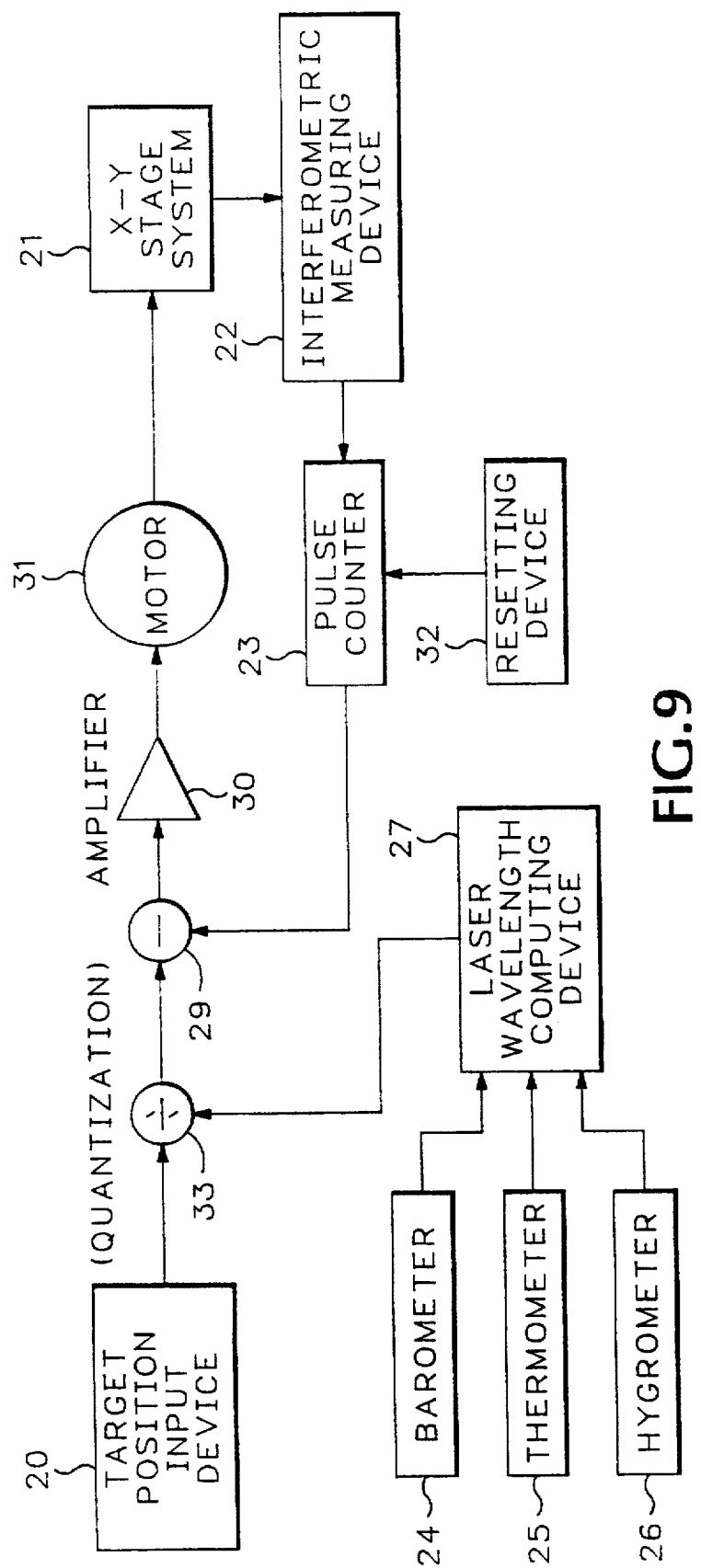
FIG. 9 is a block diagram of another example of the exposure head position control system according to the prior art.

Incidentally, irregularities of shadow mask patterns are considered to be attributable to irregularities in the arrangement of small hole patterns produced when shadow mask patterns are drawn by a photolithographic apparatus such as that shown in FIG. 6, but most of the irregularities are attributable to instability of the wavelength of laser light used in a distance measuring system that employs an interferometer (as will be clear from the above equation d=N×$\lambda$/4, a change in the wavelength $\lambda$ of the laser light makes the actual movement d different for the same count N). Because the wavelength $\lambda$ in the air changes with the atmospheric pressure, temperature and humidity, factors in the instability of the wavelength of the laser light may be considered to be 1) the atmospheric pressure, 2) temperature and 3) humidity of the air in the optical path where the laser light passes. In the case of an electron beam lithographic apparatus, the instability of wavelength can be eliminated by placing the optical path of laser light in a vacuum, but in the case of a photolithographic apparatus, which is large in size, the whole apparatus cannot be placed in a high-vacuum system from the viewpoint of cost and it is therefore necessary to make real-time correction for a change in wavelength due to 1) the atmospheric pressure, 2) temperature and 3) humidity of the air in the optical path of laser light. FIGS. 8 and 9 show examples of position control system designed for this purpose.

In the example shown in FIG. 8, a target position to which the exposure head 2 and the photosensitive plate P are to be positioned relative to each other is input from a target position input device 20 for each exposure operation. In actual practice, target positions which have previously been programmed are inputted successively. Pulse signals from an interferometric measuring device 22, which comprises an interferometer such as that shown in FIG. 7 and a circuit that outputs a Doppler shift obtained therefrom in the form of pulses, are subjected to addition or subtraction in a pulse counter 23. As described above, the pulse count value represents a relative movement of the exposure head 2 and the photosensitive plate P, that is, the position of an X-Y stage system 21. Incidentally, there are provided a barometer 24 that detects the pressure of an atmosphere where the photolithographic apparatus is placed, a thermometer 25 that detects the atmospheric temperature, and a hygrometer 26 that detects the humidity, and detected signals from these detectors are sent to a laser wavelength computing device 27 to obtain the actual wavelength $\lambda$ in the air in the present state, which is obtained by correcting the wavelength $\lambda_0$ in a vacuum, with reference to a table previously stored therein (the wavelength may be obtained according to Owen's equation that expresses the relationship between the atmospheric pressure, temperature and humidity on the one hand and the wavelength on the other; see Keiei Kudo, "Charts of Basic Physical Properties—Mainly Spectral Properties," Kyoritsu Shuppan K. K., May 15, 1972, p. 138). The count of the pulse counter 23 is multiplied by the wavelength $\lambda$ given by the laser wavelength computing device 27 in a multiplier 28 to obtain the present position of the X-Y stage system 21 (if a distance measuring device that outputs 1 pulse for each movement of 1/n wavelength is employed, the count is multiplied by $\lambda$/n). A difference between the target position that is input from the target position input device 20 and the present position that is corrected as described above is obtained by a subtracter 29 for calculating a position error. The error signal thus obtained is amplified in an amplifier 30 and then applied to a servomotor 31 that moves the X-Y stage system 21 in the directions X and Y, thereby moving the exposure head 2 and the photosensitive plate P to the target relative position, that is, the target position that has been corrected for an error in the measured value due to a wavelength change in the distance measuring system, and thus enabling exposure to be repeated while stepwisely moving the exposure head 2 and the photosensitive plate P with high accuracy. It should be noted that the control of movement is started after the moving mirrors 11 and 12, which are associated with the interferometers 7 and 8, have been returned to their origins (reference positions) and the counter 23 has been reset to zero at this position by a resetting device 32. The example that is shown in FIG. 9 is a modification of the control system shown in FIG. 8, in which a target position that is input from the target position input device 20 is divided in a divider 33 by the actual wavelength $\lambda$ that is output from the laser wavelength computing device 27, thereby quantizing the target position in advance, and a comparison is made between the target digital value obtained by the quantization and the digital value representative of the present position which has been cumulated in the pulse counter 23, thereby generating an error signal. This system performs essentially the same function as that of the system shown in FIG. 8.

Figure 10A:
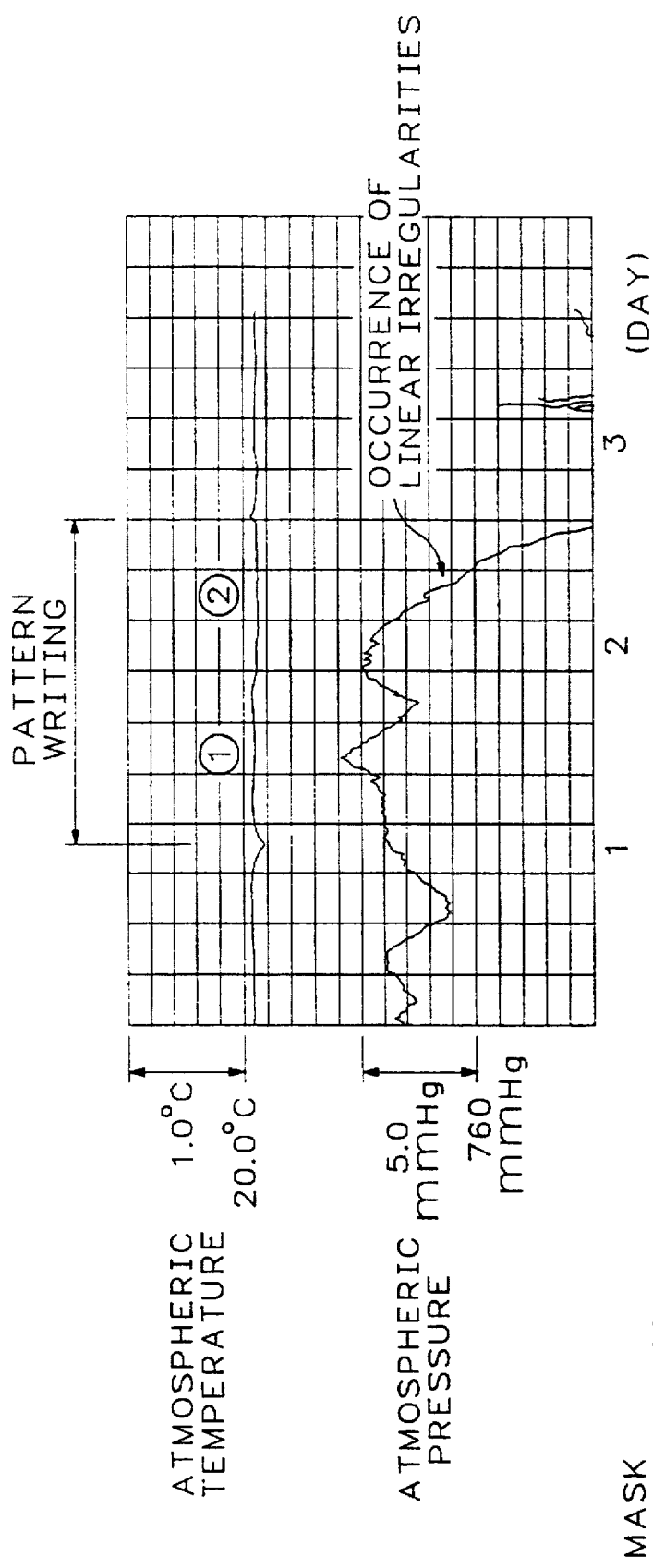
FIGS. 10(a) and 10(b) show shadow mask pattern writing conditions and irregularities generated under these conditions.
Figure 10B:
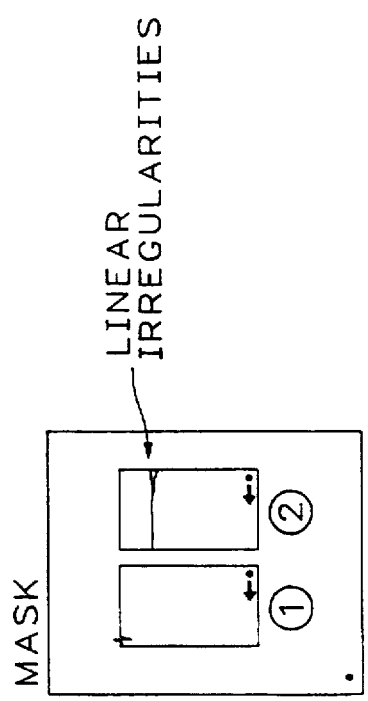

However, even if a photolithographic apparatus is arranged such that the accuracy in positioning the exposure head 2 and the photosensitive plate P relative to each other is independent of the conditions of the atmosphere by utilizing the position control system shown in FIG. 8 or 9, irregularities still occur due to a lowering in the positional accuracy of small hole patterns which should be arranged regularly. FIGS. 10(a) and 10(b) show one example of such irregularities. In this example, first and second mask patterns (see FIG. 10(b)) were written in succession, spending more than 1 day, in an atmosphere where the air temperature was substantially constant but the air pressure was variable (see FIG. 10(a)). Linear irregularities occurred when the atmospheric pressure changed suddenly during the process for the second mask pattern.

For example, if a photolithographic apparatus such as that shown in FIG. 6 employs a distance measuring system that comprises interferometers having an optical system such as that shown in FIG. 7, the movement of the exposure head 2 is measured from a measurement start point (origin) which is selected in the directions of movement of the moving mirrors 11 and 12. This is because a distance measuring system that comprises Michelson interferometers such as that shown in FIG. 7 is designed to measure a relative movement. The measurement start point must be somewhat spaced apart from the polarization beam splitter 15 across the air in the distance measuring direction from the viewpoint of the mechanical arrangement. This will also be understood from the fact that the moving mirrors 11 and 12 cannot completely be brought into contact with the associated interferometers 7 and 8. Upon the actual position control of the exposure head 2, the movement control to the desired target position is started after the exposure head 2 has been returned to the measurement start point (origin) and the controller has been reset by the resetting device 32, as shown in FIGS. 8 and 9.

Various examinations have revealed that the above-described irregularities in shadow mask patterns occur due to a wavelength change in the air in the optical path between the origin and the polarization beam splitter (this optical path will hereinafter be referred to as "dead path"). This will be explained below in more detail. Specifically, the distance of this dead path is on the order of 0.2 to 0.3 m, and a pitch error of about 0.1 μm occurs irregularly. More specifically, in the conventional controllers shown in FIGS. 8 and 9, an origin is set, as shown in FIGS. 11(a) and 11(b), and the controller is reset with respect to this point (see FIG. 11(a)). Then, a target position is input, and the exposure head 2 is moved by effecting position control by the servo-system shown in FIG. 8 or 9 (see FIG. 11(b)). In the prior art, however, correction is made only for a wavelength change in the path between the origin and the moving mirror 11 (12), but no correction is made for a wavelength change in the dead path between the polarization beam splitter 7 (8) and the origin. For this reason, a wavelength change in this dead path causes the count of pulses to change correspondingly, so that no accurate movement control can be effected and the above-described irregularities occur in the resulting shadow mask pattern.

Figure 12:
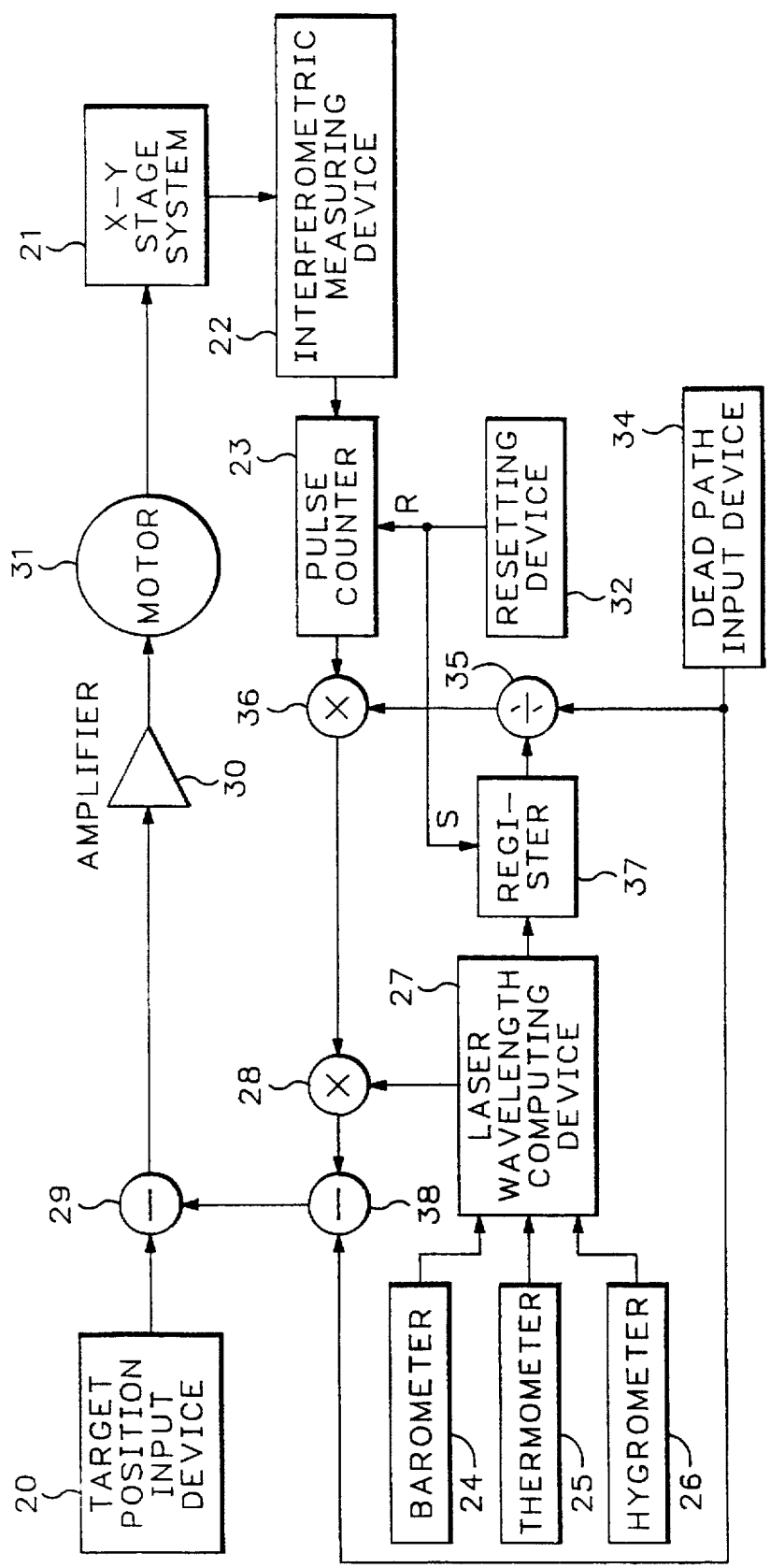
FIG. 12 is a block diagram of a position controller in one embodiment of the photolithographic apparatus according to the present invention.

Under these circumstances, one embodiment of the photolithographic apparatus according to the present invention adopts a position control system such as that shown in FIG. 12 in order to correct a wavelength change in the dead path. More specifically, a target position which is measured from the origin and where the exposure head 2 should be positioned is input from a target position input device 20 for each exposure operation (in actual practice, target positions which have previously been programmed are input successively). Pulse signals from an interferometric measuring device 22, which comprises an interferometer such as that shown in FIG. 7 and a circuit that outputs a Doppler shift obtained therefrom in the form of pulses, are subjected to addition or subtraction in a pulse counter 23. The pulse counter 23 is reset to zero by a resetting device 32 when an X-Y stage system 21 is returned to the origin at the time of starting an exposure operation. Accordingly, the pulse count value represents a movement of the exposure head 2 from the origin, that is, the position of the X-Y stage system 21 relative to the origin. In addition, there are provided a barometer 24 that detects the pressure of an atmosphere where the photolithographic apparatus is placed, a thermometer 25 that detects the atmospheric temperature, and a hygrometer 26 that detects the humidity, and detected signals from these detectors are sent to a laser wavelength computing device 27 to obtain the actual wavelength $\lambda$ in the air in the present state, which is obtained by correcting the wavelength $\lambda_0$ in a vacuum, with reference to a table previously stored therein, in the same way as in the prior art (see FIG. 8). It should be noted that the wavelength may be obtained according to the above-mentioned Owen's equation, which expresses the relationship between the atmospheric pressure, temperature and humidity on the one hand and the wavelength on the other. The wavelength $\lambda_S$ in the air at the time when the pulse counter 23 is reset is stored in a register 37 from the laser wavelength computing device 27 on the basis of a signal from the resetting device 32. In this embodiment, a dead path input device 34 is provided to give the length of a dead path (in actual practice, it is read from a memory). The dead path length that is output from the dead path input device 34 is divided in a divider 35 by the wavelength $\lambda_S$ at the time of resetting to the origin, stored in the register 37, and the resulting quotient (i.e., a digital value reduced by the wavelength $\lambda_S$ in the dead path at the time of resetting) is added to the count of the pulse counter 23 in an adder 36. The resulting sum is multiplied by the wavelength $\lambda$ in the air at the present time, which is output from the laser wavelength computing device 27, in a multiplier 28 to obtain the actual present position of the X-Y stage system 21 (i.e., the position that is measured from the polarization beam splitter). Then, the dead path length output from the dead path input device 34 is subtracted from the signal representative of the present position in a subtracter 38, thereby obtaining the present position of the X-Y stage system 21 measured from the origin, which has been corrected for wavelength changes in the dead path and the optical path between the origin and the present position. A difference between the target position that is input from the target position input device 20 and the present position that is corrected as described above is obtained by a subtracter 29 for calculating a position error. The error signal thus obtained is amplified in an amplifier 30 and then applied to a servomotor 31 that moves the X-Y stage system 21 in the directions X and Y, thereby moving the exposure head 2 to the target position, that is, the target position that has been corrected for an error in the measured value due to wavelength changes in all the spaces in the distance measuring system, and thus enabling exposure to be repeated while stepwisely moving the exposure head 2 and the photosensitive plate P with high accuracy.

The operation of the above-described controller will be explained by mathematics. Assuming that a target position that is input from the target position input device 20 is A and a dead path length that is output from the dead path input device 34 is D and that the X-Y stage system 21 is at rest at the target position after reaching there without an error by an operation of the feedback control system shown in FIG. 12. The register 37 has been stored with the wavelength $\lambda_S$ at the time when the X-Y stage system 21 was returned to the origin and the pulse counter 23 was reset to zero. In addition, the multiplier 28 has been supplied with the wavelength $\lambda$ in the air at the present time from the laser wavelength computing device 27. In this state, the pulse counter 23 ought to have counted $(A+D)/\lambda - D/\lambda_S$ pulses. Since a digital value for $D/\lambda_S$ is output from the divider 35, a digital value for $(A+D)/\lambda$ is output from the adder 36. This is multiplied by $\lambda$ in the multiplier 28 to output a value for $(A+D)$, that is, a distance from the polarization beam splitter 15 to the moving mirror 11 (12). The dead path length D is subtracted from the distance $(A+D)$ in the subtracter 38 to obtain the target position A. In other words, even if the wavelength changes from $\lambda_r$ to $\lambda$, employment of the above-described control system enables the wavelength change in the dead path to be also corrected and hence allows the X-Y stage system 21 to be moved accurately to the target position by feedback control. In the prior art that is not provided with the dead path input device 34, the divider 35, the adder 36, the register 37 and the subtracter 38, as in FIG. 8, the value that is output from the subtracter 38 under the same conditions is $A - D \times \lambda/\lambda_r$, so that the X-Y stage system 21 is moved to an erroneous position by the feedback loop, although it has reached the target position A without an error. Accordingly, with the above-described position controller of the present invention, even if there is a change in the atmospheric pressure, temperature or humidity of the photolithographic apparatus, no irregularities will occur in the resulting shadow mask.

Figure 13:
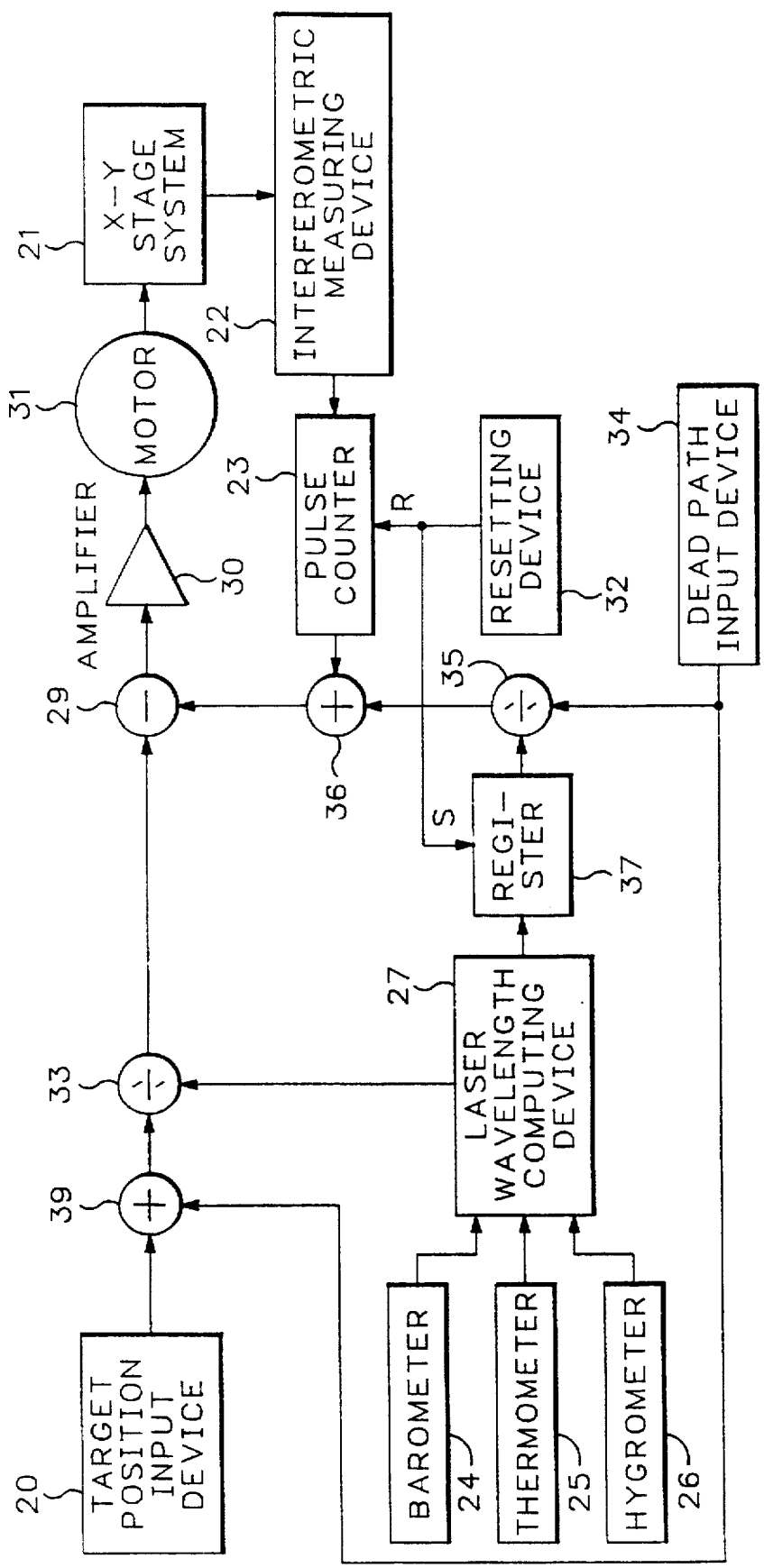
FIG. 13 is a block diagram of a position controller in another embodiment of the photolithographic apparatus according to the present invention.

The controller shown in FIG. 12 may also be modified in the same way as in the case of the prior art that is shown in FIG. 9. More specifically, as shown in FIG. 13, a target position, which is obtained by adding together a target position based on the origin and a dead path length in an adder 39, is divided in a divider 33 by the actual wavelength λ output from the laser wavelength computing device 27 to quantize the target position in advance, and the target digital value obtained by the quantization is compared with a value that is obtained by adding a digital value reduced by the wavelength $\lambda_r$ in the dead path at the time of resetting to the count of the pulse counter 23, that is, a digital value which is representative of the present position, thereby generating an error signal. The operation of this modification is essentially the same as in the case of the controller shown in FIG. 12.

Incidentally, the embodiments shown in FIGS. 12 and 13 are arranged such that the whole of a photolithographic apparatus such as that shown in FIG. 6 is placed in the air and patterns are drawn by controlling the relative position of the stage 1 and the exposure head 2. However, the arrangement may be such that only the stage 1, the exposure head 2 and the moving mirrors 11 and 12 are accommodated in a vacuum chamber 40, while the interferometers 7 and 8 are disposed in the air, as shown schematically in FIG. 14, so that light that travels toward the moving mirror 11 (12) through the interferometer 7 (8) is introduced through a window 41 provided in the vacuum chamber 40. In such a case, a wavelength change occurs only in a section D' of the dead path D which extends between the beam splitter and the window 41. In this case, the dead path length that is handled in the controllers shown in FIGS. 12 and 13 is not D but D'.

Although in the foregoing embodiments the resetting device 32 that resets the pulse counter 23 when the X-Y stage system 21 is moved to the origin is assumed to be a manually operated, it should be noted that any known device, for example, a mechanical, optical, electric, magnetic or photoelectric device, may be employed as long as it is adapted to send a signal to a reset terminal of the pulse counter 23 when the X-Y stage system 21 has reached a predetermined origin, by automatically detecting this fact.

Although the foregoing description has been made about some embodiments of an exposure head position controller of a photolithographic apparatus for use in the production method according to the present invention, it should be noted that the present invention is not necessarily limited to the described embodiments and that various modifications and changes may be imparted thereto. For example, the arrangement may be such that, when the X-Y stage system 21 is moved to the origin, the pulse counter 23 is not reset, but a value that is output from the divider 35 is preset to the pulse counter 23. In addition, the present invention may be applied not only to a photolithographic apparatus for forming shadow mask patterns but also to other types of apparatus, for example, a photolithographic apparatus that employs a Michelson interferometer to effect position control.

As has been described above, the photolithographic apparatus for use in the method of producing master and working pattern plates for etching according to the present invention is provided with a memory means for storing the wavelength in the air at the time of resetting the count of the counter to zero when the moving mirror is moved to the origin, and it is arranged such that a value that is obtained by dividing the distance between the beam splitter and the origin by the wavelength stored in the memory means is added to the value of the counter, and the resulting sum is multiplied by the wavelength in the air at the present time, and further the distance between the beam splitter and the origin is subtracted from the value obtained by the multiplication, and the position of the moving mirror is feedback-controlled on the basis of the difference between the value obtained by the subtraction and the target position of the moving mirror. Accordingly, even if the wavelength changes due to a change in the pressure, temperature or humidity of the air in the dead path between the beam splitter and the origin, the position error due to this change is corrected. Thus, even if there is a change in the atmospheric pressure, temperature or humidity of the photolithographic apparatus for forming shadow mask patterns, the resulting shadow mask has no irregularities, which would otherwise be generated due to a lowering in the positional accuracy of small hole patterns which should be arranged regularly.

What we claim is:

1. A photolithographic apparatus which is arranged to prepare individual pattern date required for an etching pattern plate comprising an alignment mark pattern, a hole pattern, a frame pattern, etc., prepare single synthetic pattern data by subjecting each of said individual pattern data to a logical operation, and effect continuous and collective exposure to a photosensitive glass plate by use of said synthetic pattern data to form a latent image corresponding to said synthetic pattern data, and which has a device that controls the movement of a moving mirror of a Michelson interferometer from its origin by counting the number of interference fringes, or Doppler shift frequency, from said interferometer with a counter, thereby controlling the relative position of an exposure head and a photosensitive plate, wherein the improvement comprises a position controller that sets the origin of said moving mirror at a distance from a beam splitter of said Michelson interferometer, moves said moving mirror to the origin to reset the count of said counter to zero and then feedback-controls the position of said moving mirror on the basis of the difference between a value obtained by multiplying the count of said counter by the wavelength in the air at the present time and a target position of said moving mirror, said position controller having a memory means for storing the wavelength in the air at the time when said moving mirror is moved to the origin and said counter is reset to zero, and said position controller being arranged such that a value obtained by dividing the distance between said beam splitter and the origin by the wavelength stored in said memory means is added to the count of said counter; the resulting sum is multiplied by the wavelength in the air at the present time; the distance between said beam splitter and the origin is subtracted from the resulting product; and the position of said moving mirror is feedback-controlled on the basis of the difference between the result of said subtraction and a target position of said moving mirror.

2. A photolithographic apparatus which is arranged to prepare individual pattern data required for an etching pattern plate comprising an alignment mark pattern, a hole pattern, a frame pattern, etc., prepare single synthetic pattern data by subjecting each of said individual pattern data to a logical operation, and effect continuous and collective exposure to a photosensitive glass plate by use of said synthetic pattern data to form a latent image corresponding to said synthetic pattern data, and which has a device that controls the movement of a moving mirror of a Michelson interferometer from its origin by counting the number of interference fringes, or Doppler shift frequency, from said interferometer with a counter, thereby controlling the relative position of an exposure head and a photosensitive plate, wherein the improvement comprises a position controller that sets the origin of said moving mirror at a distance from a beam splitter of said Michelson interferometer, moves said moving mirror to the origin to reset the count of said counter to zero and then feedback-controls the position of said moving mirror on the basis of the difference between the count of said counter and a value obtained by dividing a target position of said moving mirror by the wavelength in the air at the present time, said position controller having a memory means for storing the wavelength in the air at the time when said moving mirror is moved to the origin and said counter is reset to zero, and said position controller being arranged such that the distance between said beam splitter and the origin is added to a target position of said moving mirror; the resulting sum is divided by the wavelength in the air at the present time; and the position of said moving mirror is feedback-controlled on the basis of the difference between the resulting quotient and a value that is obtained by adding to the count of said counter a value obtained by dividing the distance between said beam splitter and the origin by the wavelength stored in said memory means.

* * * * *

UNITED STATES PATENT AND TRADEMARK OFFICE
CERTIFICATE OF CORRECTION

PATENT NO. : 5,801,833
DATED : September 1, 1998
INVENTOR(S) : Kei Kobayashi et al It is certified that error appears in the above-identified patent and that said Letters Patent is hereby corrected as shown below:

Title page,
Item [22], the filing date of the application "December 29, 1995" should be -- December 28, 1995 --

Signed and Sealed this

Twenty-first Day of September, 2004

JON W. DUDAS
*Director of the United States Patent and Trademark Office*